United States Patent [19]

Hollingsworth

[11] Patent Number: 5,759,745
[45] Date of Patent: Jun. 2, 1998

[54] METHOD OF USING AMORPHOUS SILICON AS A PHOTORESIST

[75] Inventor: Russell E. Hollingsworth, Denver, Colo.

[73] Assignee: Materials Research Group, Inc., Wheat Ridge, Colo.

[21] Appl. No.: 567,758

[22] Filed: Dec. 5, 1995

[51] Int. Cl.$^6$ ........................................... G03F 7/00
[52] U.S. Cl. ........................... 430/313; 430/317; 430/323
[58] Field of Search ................................ 430/311, 313, 430/317, 323, 327, 5, 396

[56] References Cited

U.S. PATENT DOCUMENTS

| | | |
|---|---|---|
| 4,960,675 | 10/1990 | Tsuo et al. |
| 5,041,361 | 8/1991 | Tsuo . |
| 5,260,235 | 11/1993 | Dooley ................................... 437/228 |

OTHER PUBLICATIONS

R. T. Collins, M. A. Tischler and J. H. Stathis; "Photoinduced Hydrogen Loss from Porous Silicon"; Oct. 5, 1992; Applied Physics Letter 61, American Institute of Physics.

M. Takai, S. Indou and H. Murase; Mechanism of In-Situ Photoluminescence Decay in Porous Silicon and its Application to Maskless Patterning; ??; Material Research Symp. Proc. vol. 283.

J. P. Conde, K. K. Chan, J. M. Blum, M. Arienzo, et al; Annealing Kinetics of a-Si:H Deposited by Concentric-Electrode RF Glow Discharge at Room Temperature; Feb. 25, 1996; Journal of Applied Physics 73, American Institute of Physics.

A. Takano, M. Kawasaki and H. Koinuma; In Situ Determination of Optical Constants of Growing Hydrogenated Amorphous Silicon Film by P-Polarized Light Reflectance Measurement on the Surface; Jun. 1, 1993; Journal of Applied Physics 73, American Institute of Physics.

*Primary Examiner*—Kathleen Duda
*Attorney, Agent, or Firm*—Stephen C. Shear

[57] ABSTRACT

A method of using amorphous silicon as a photoresist is disclosed herein. The photoresist is produced by first forming a thin film including at least an outermost layer which includes hydrogenated amorphous silicon onto a suitable surface. Predetermined areas of the outermost layer are then exposed to ultraviolet light. Following exposure, the unexposed areas of the outermost layer, along with any underlying associated portions of the film, are removed so as to reveal the surface in areas which underlie the unexposed outermost layer areas. In a first feature, the outermost layer is formed at a temperature no greater than about 100° C. In a second feature, the predetermined areas of the outermost layer are exposed to ultraviolet light at a temperature no greater than about 100° C. In a third feature, the film is formed entirely from hydrogenated amorphous silicon. In a fourth feature, the film is formed by first applying an amorphous silicon layer to the surface and, thereafter, hydrogenating the amorphous silicon layer to form the outermost layer.

25 Claims, 2 Drawing Sheets

METHOD OF USING AMORPHOUS SILICON AS A PHOTORESIST

BACKGROUND OF THE INVENTION

The present invention relates generally to a resist formed using amorphous silicon and more particularly to an amorphous silicon based photoresist produced using ultraviolet light in accordance with the method of the present invention.

The standard photoresist which has been used, for example, in photolithographic processes for the fabrication of semiconductor devices has been an organic compound. This organic photoresist is generally spun onto a surface of a substrate to form a relatively uniform layer and is thereafter selectively exposed to some form of energy, generally ultra-violet light, whereby to create a pattern corresponding to particular discrete electronic elements which comprise the device being produced. These discrete elements may include diodes, transistors, and inductors among others. Following exposure, either the exposed portions or the unexposed portions of the photoresist are removed to reveal predetermined areas of the substrate surface. The revealed substrate areas are then treated using a wide variety of well known techniques in conjunction with an overall process for producing portions of and electrically interconnecting the discrete electronic elements in or on the substrate. The process continues with successive steps in which additional photoresist layers can be applied to the substrate for use in building consecutive portions of the desired elements until such time that the process is ultimately completed.

Because the semiconductor industry is driven to continually improve the functionality of semiconductor devices while, at the same time, limit or reduce the overall size of such devices, ever larger numbers of increasingly smaller discrete elements are being incorporated into respective semiconductor devices. As the discrete elements which make up the devices become progressively smaller, the feature sizes of these elements are, of course, correspondingly reduced. Consequently, each process step used in the formation of the elements must, therefore, be capable of forming these reduced feature sizes. In spite of the past efficacy of the above described organic photoresist process, certain limitations in its continued use in semiconductor fabrication have become evident in view of the continuing goals of the semiconductor manufacturing community with regard to miniaturization and improved functionality, as will be described immediately hereinafter.

In view of the continuing requirement for reduced feature sizes, photoresists must be increasingly capable of producing patterns that can resolve still finer details so as to produce smaller element features. One problem ultimately limiting the smallest feature sizes which can be produced by organic photoresists is the size of the molecules that make up its specific organic structure.

Another problem which must be considered in the use of organic photoresists resides in the fact that organic photoresists are prone to introducing contaminants into the substrate on which they are deposited. In the past, these contaminants were not of particular concern due to the relatively large feature sizes of previous devices, but as required feature sizes have decreased, such contaminants can now render a respective semiconductor device inoperable. Therefore, manufacturing costs have been increased by, for example, the necessity for contaminant removal by taking more stringent cleaning process steps as feature sizes are reduced. Moreover, manufacturing costs are increased by contaminant induced reduction of system through-put.

Still another problem limiting the usefulness of organic photoresists relates directly to certain reactions of the photoresist with the UV light which is typically used in its exposure. More specifically, the entire depth of an organic photoresist is developed by incident UV light. Unfortunately, diffraction effects occur within the photoresist layer which alter the path of the UV light. Therefore, the desired pattern formed at the surface of the photoresist is progressively altered throughout the overall thickness of the photoresist layer, resulting in an altered reproduction of the desired pattern ultimately produced in the developed photoresist. This diffraction effect limits the resolution of element features reproducible by organic resists. Each of the above concerns directly limit the futture usefulness of organic photoresists in the semiconductor arts.

More recently, in an attempt to alleviate these problems, it has been suggested to use a thin-film layer of amorphous silicon as a resist. Such a method is described in U.S. Pat. Ser. 5,041,361. The use of amorphous silicon as a resist provides a significant advancement over the use of organic photoresists with regard to some of the foregoing problems. More specifically, smaller feature sizes can potentially be produced in amorphous silicon (a-Si) which are limited only by the sub-atomic characteristics of the a-Si itself, as opposed to the limitations imposed by the grain size characteristics of organic resists. Moreover, since semiconductor devices are generally produced on silicon substrates, the use of a-Si does not introduce organic or other dissimilar contaminants into the manufacturing process.

Even though the '361 patent provides the above advantages, there are certain disadvantages inherent in its approach. In particular, a scanned ion beam approach is used to form detailed element features. This technique is too slow to be widely accepted by the semiconductor industry. The patent also suggests exposing a broad substrate surface to a wide collimated ion beam using an intermediate patterned mask to develop the a-Si resist. Unfortunately, using this latter approach severely limits pattern resolution since such patterned masks are difficult to produce and become too fragile as element feature sizes are reduced.

The foregoing difficulties are resolved by the highly advantageous approach and heretofore unseen method of the present invention, as will be described hereinafter.

SUMMARY OF THE INVENTION

As will be described in more detail hereinafter, a method of using amorphous silicon as a photoresist is disclosed herein. In accordance with the present invention, a thin film including at least an outermost layer including hydrogenated amorphous silicon is formed onto a suitable surface. Predetermined areas of the outermost layer are then exposed to ultraviolet light. Following exposure, the unexposed areas of the outermost layer, along with any underlying associated portions of the film, are removed so as to reveal the surface in areas which underlie the unexposed outermost layer areas.

In a first feature of the present invention, the outermost layer is formed at a temperature no greater than about 100° C.

In a second feature of the present invention, the predetermined areas of the outermost layer are exposed to ultraviolet light at a temperature no greater than about 100° C.

In a third feature of the present invention, the film is formed entirely from hydrogenated amorphous silicon.

In a fourth feature of the present invention, the film is formed by first applying an amorphous silicon layer to the surface and, thereafter, hydrogenating the amorphous silicon layer to form the outermost layer.

BRIEF DESCRIPTION OF THE DRAWINGS

The present invention may be understood by reference to the following detailed description taken in conjunction with the drawings, in which.

DETAILED DESCRIPTION OF THE INVENTION

Figure 1:
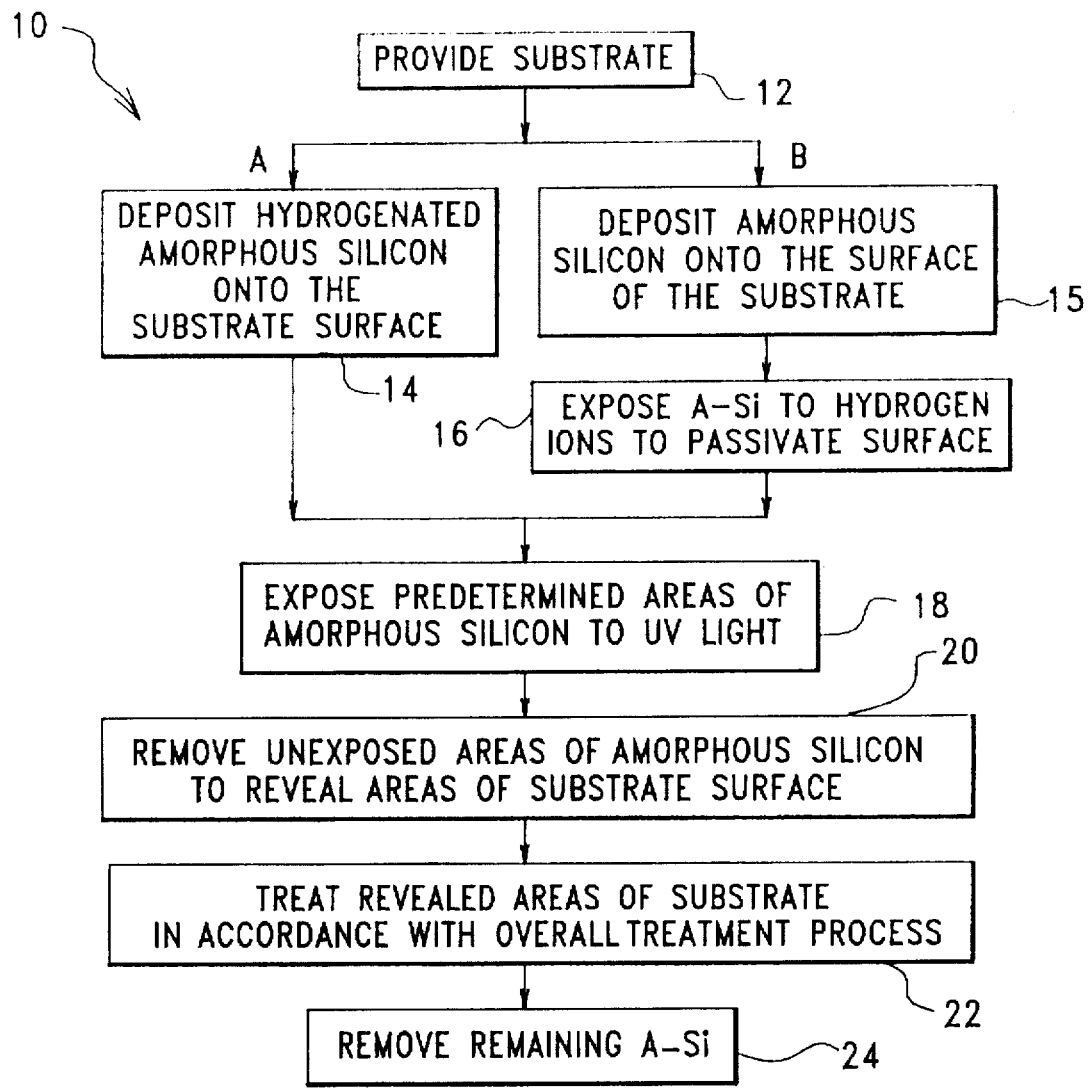
FIG. 1 is a general flow diagram illustrating the fundamental steps of the method of the present invention.

A method of using amorphous silicon as a photoresist on, for example, a substrate is disclosed herein. Attention is immediately directed to FIG. 1 which provides a basic outline in flow diagram form of the fundamental steps of the method of the present invention, generally indicated by reference numeral 10. Method 10 begins with a first step 12 in which a substrate is provided. While this method is particularly well suited for use on substrates, its application also extends to performing photolithographic processes on essentially any form of article requiring such treatment.

As depicted in FIG. 1, two alternative paths indicated as A and B are available following the completion of step 12. In the example of path A, a thin film layer of hydrogenated amorphous silicon (a-Si:H) is deposited onto a surface of the substrate in step 14. Within the overall framework of the invention, it is necessary that the surface of the deposited layer, which will ultimately be used by succeeding steps, be comprised of a-Si:H. In the present example, this requirement is fulfilled by the initially deposited a-Si:H. In the alternative example illustrated by path B, however, a-Si is deposited in step 15 rather than a-Si:H. This a-Si layer does not provide the required hydrogenated surface. Therefore, step 16 is thereafter performed to hydrogenate the a-Si whereby to provide the required a-Si:H surface. It should be noted that silicon based alloys can also be applied in accordance with the present invention. When alloys are used, the presence of additional constituents such as, for example, carbon or germanium do not affect the practice of the present invention. Therefore, the terms amorphous silicon and hydrogenated amorphous silicon, as used hereinafter, are intended to encompass variations in the composition of the deposited material which includes alloys and other such components that do not detract from the present invention as disclosed herein and, for the purposes of the invention, the presence of these alloys and other such components are considered to be equivalent to the pure counterparts regardless of whether or not they are hydrogenated.

Continuing to refer to FIG. 1, step 18 is performed once the required a-Si:H surface is provided by either path described above. In step 18, predetermined areas of the thin film a-Si:H layer are exposed to a source of ultraviolet light to provide a very thin surface layer of silicon dioxide in the predetermined areas on the top surface of the a-Si:H. Next, etching is performed in step 20 to remove unexposed areas of the a-Si:H film and any associated underlying material to reveal portions of the surface of the substrate directly therebeneath. Step 22 then treats the revealed surface portions using well known techniques which, for example, introduce certain materials such as dopants into the regions associated with the revealed surface portions whereby to alter the electrical properties of the substrate material in these regions or to provide a surface structure thereon such as an electrical conductor. Thereafter, the remaining a-Si, including its overlying silicon dioxide layer, can be removed in step 24 to reveal the untreated areas of the substrate surface.

Figure 2:
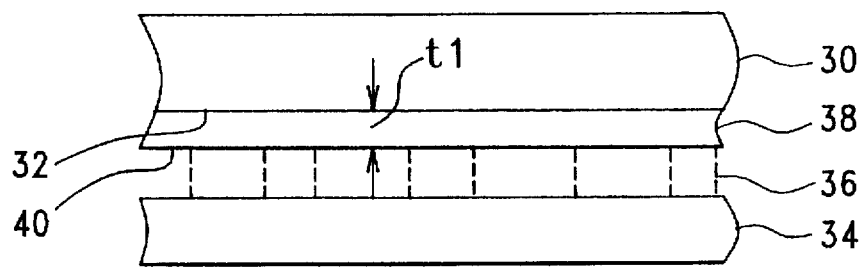
FIG. 2 is a diagrammatic cross-sectional view, in elevation, of a substrate positioned confronting a deposition source shown here to illustrate the deposition of a thin film layer of hydrogenated amorphous silicon onto a substrate in accordance with the present invention.

Having generally described the steps of the method of the invention, a detailed description will now be provided in view of FIG. 1 and with reference to physical embodiments which are diagrammatically illustrated in FIGS. 2–6. Attention is now directed to FIG. 2 in which a substrate 30, initially provided in step 12, includes a surface 32. Substrate 30 is generally a single crystal semiconductor material such as silicon, however other materials such as, for example, glass, metals, plastic and alternative semiconductor materials including gallium arsenide may provide suitable surfaces to which photolithographic treatments can be applied. Moreover, the present invention is not limited to use on substrates and, therefore, surface 32 could form part of another thin film layer supported by, for instance, an intermediate assembly in an overall semiconductor device (not shown).

Continuing to refer to FIGS. 1 and 2, surface 32 of substrate 30 is placed in a confronting relationship with a deposition source 34 which emits a-Si:H 36 per step 14 of path A. In accordance with the present invention, a-Si:H 36 is deposited onto the substrate at a temperature of no more than about 100° C. The significance of this temperature restriction will be described at an appropriate point in the discussion below. Deposition source 36 may comprise any suitable source for emitting the subject material such as a plasma enhanced chemical vapor deposition source or a sputtering source. The emitted a-Si:H 36 forms a thin film a-Si:H layer 38 on the substrate having a thickness t1 and an outermost surface 40. It is worthy of mention that source 34 is intentionally illustrated as directing the emitted material upward. This arrangement eliminates the possibility of production yields being reduced by particulate or other contaminants falling onto surface 32 of the substrate being treated. For illustrative purposes, thickness t1 of the a-Si:H layer has been exaggerated, typically its thickness is only required to be about 5,000 angstroms and, particularly in cases where high resolution lithography is being performed, layer 38 should be kept as thin as possible. As previously mentioned, outermost surface 40 must be hydrogenated (passivated). In the present example, this need is satisfied since the entire layer, including surface 40, is hydrogenated. However, in other cases where non-hydrogenated a-Si is initially deposited, as in the following example, an additional step is required to passivate surface 40.

Figure 3:
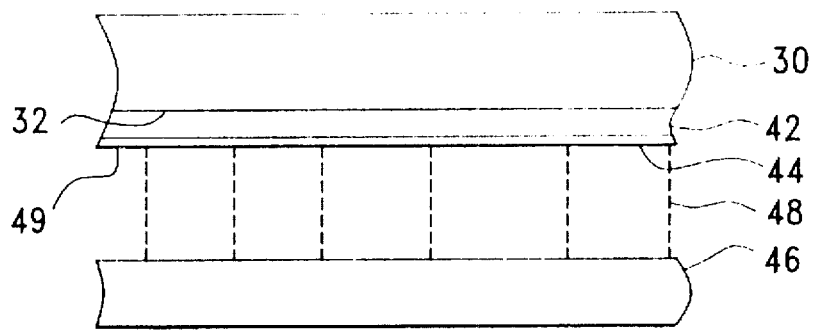
FIG. 3 is a diagrammatic cross-sectional view, in elevation, of a substrate bearing a non-hydrogenated a-Si layer positioned confronting a hydrogen ion source, shown here to illustrate the formation of an outermost layer of hydrogenated a-Si using a hydrogen plasma source.

Attention is now directed to FIG. 3 which illustrates alternative path B wherein a non-hydrogenated a-Si layer 42 having an outer surface 44 has been deposited onto surface 32 of substrate 30 according to previously described step 15. In order to accomplish passivation of surface 44, step 16 must be performed in which surface 44 is exposed to a hydrogen plasma source 46 which, in the present example, emits low energy hydrogen ions 48. Exposure of a-Si surface 44 to these low energy hydrogen ions 48 converts a-Si at or near surface 44 into a surface a-Si:H layer 49, as required. Alternatively source 46 may emit hydrogen atoms (not shown) to hydrogenate surface 44. In still another alternative (not shown), a-Si surface 44 may be hydrogenated by, for example, exposing the surface to a hydrofluoric acid solution, which is a well known technique in the art. Other techniques for hydrogenating surface 44 may also be found to be useful. These alternatives are all considered to be within the scope of the present invention. In the case where low energy hydrogen ion or atom exposure is utilized, suitable exposure times may be in the range of minutes, although much longer exposures may be performed with no deleterious effects. Like step 14 for applying an a-Si:H layer, hydrogenization step 16 must be performed at a temperature of no more than about 100° C. The significance of the foregoing temperature requirements will be described immediately hereinafter.

The specific temperature requirements described above result in the production of a-Si:H layers having relatively high hydrogen content at an outermost surface. This hydrogen content is important in the remaining steps to be performed. Moreover, exposure of such a-Si:H layers to high temperatures above 100° C. results in outgassing or loss of hydrogen required herein. Additionally, a-Si:H layers deposited at such temperatures above 100° C. do not provide the requisite hydrogen at their outermost surface. In either instance (high temperature exposure during formation or at some point thereafter) such a-Si:H layers do not exhibit pattern forming characteristics useful as a photoresist. In contrast, actual experimental results have confirmed a surprising improvement in the ability of a-Si:H layers produced in accordance with the present invention to form distinct patterns, useful as a photoresist. In the past, for applications unrelated to the present invention, the deposition of a-Si or its hydrogenated form was typically performed at much higher temperatures in the general range of 100° C. to 200° C. This high temperature deposited a-Si is still typically used in applications such as, for example, thin film transistors in liquid crystal display devices where certain electrical properties of the a-Si including the carrier mobility are critical to the proper operation of such devices. Because these electrical properties are known to degrade in a-Si which is deposited at low temperatures, a-Si or its hydrogenated form has rarely been deposited or formed at the lower temperatures contemplated by the present invention. Therefore, little investigation of its altered physical properties has been carried forth. What Applicant has discovered is a remarkable and highly advantageous pattern forming characteristic of amorphous silicon formed at near room temperature within the overall method of the present invention which to his knowledge has heretofore been unknown.

Figure 4:
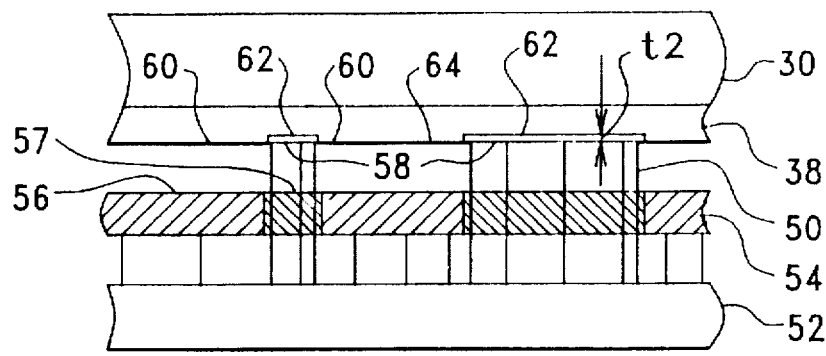
FIG. 4 is a diagrammatic cross-sectional view, in elevation, of a substrate having a hydrogenated amorphous silicon layer positioned opposing an ultraviolet light source which selectively exposes the substrate through a patterned film.

Referring now to FIGS. 1 and 4, substrate 30 is shown including a-Si:H layer 38 formed in step 14. Step 18 is performed on a-Si:H layer 38 by exposing the latter to ultraviolet light 50 emitted by a UV light source 52. As in conventional photolithography, a film 54 which includes a predetermined pattern of opaque segments 56 and UV light transparent segments 57 is positioned so as to permit UV light 50 to reach predetermined areas 58 of a-Si:H layer 38 by passing through transparent segments 57, while other portions 60 of layer 38, corresponding to opaque segments 56, remain unexposed. Film 54 can be positioned at any intermediate point between the substrate and light source, as shown. Alternatively, in performing high resolution lithography, the film can be supported directly on a-Si:H layer 38 and reused indefinitely in this manner (not shown). Unlike organic photoresists, the inorganic a-Si:H will not contaminate the mask thereby shortening its useful life. During exposure, the incident UV light removes or knocks hydrogen atoms off of the surface of a-Si:H layer 38. These missing hydrogen atoms vacate "dangling bonds" associated with silicon atoms at the a-Si:H surface. Thereafter, oxygen atoms combine with the silicon atoms to provide electrons which stably fill the dangling bonds whereby to accelerate the formation of a thin silicon dioxide layer 62 having a thickness t2 in the UV exposed areas of an outer surface portion 64 of a-Si:H layer 38. It should be noted that thickness t2 of silicon dioxide pattern 62 is exaggerated for illustrative purposes.

Referring once again to FIGS. 1 and 3, the ion generated a-Si:H layer 49 produced in path B by steps 15 and 16 is exposed to UV light in the same manner as the path A deposited a-Si:H layer 38. It should be appreciated that in either case the ultimately produced hydrogenated a-Si surface is essentially opaque to UV light. Thus, penetration of the UV light into either layer is therefore limited. For this reason, dangling bonds are only formed at or very near the surface of the a-Si:H regardless of the overall thickness of the layer. Because oxygen atoms fill these dangling bonds to form the Si—O2 layer, the latter is caused to be equally thin using either of the above-described techniques for providing an a-Si:H layer. The actual thickness t2 of the Si-O2 layer can range from 5 Å to more than 20 Å.

In accordance with the present invention, the UV exposure step, like the previously described step of forming the respective a-Si:H layers, should also be performed at a temperature no greater than about 100° C. to avoid hydrogen loss. While a pattern can still be generated when UV exposure is performed at higher temperatures, the pattern is degraded as compared with patterns generated using low temperature UV exposure and the full benefits of the invention are not realized. Moreover, the method of the present invention is advantageous since low temperature process steps are much more economical to perform than equivalent steps performed at high temperatures and they are more compatible with semiconductor processes generally.

UV exposure times may vary according to the strength of the UV source such that an Si—O2 layer having a thickness in the approximate range of 5 Å to 10 Å is produced. The latter thickness is more than adequate for the purposes of the invention. It is noted that longer exposure times do not adversely affect the Si—O2 layer or dramatically increase its thickness due to the combined factors of limited UV penetration and limited availability of hydrogen in the exposed region. The nature of Si—O2 layer 52 provides significant advantages when used in the photolithographic process of the present invention, as will be described immediately hereinafter.

In the prior art, the accepted practice has long been to develop the entire thickness of a resist material layer. For example, this is exactly the case with regard to organic photoresists exposed using UV. As previously discussed, these organic photoresists experience problems resulting from diffraction of the UV light within the photoresist layer. The diffraction causes a corresponding distortion in the development of the desired pattern in the depth of the overall layer. Even in the most recently disclosed techniques, for example those in the previously cited '361 patent, an a-Si layer is implanted with oxygen ions. The oxygen ions are embedded into the a-Si layer which will oxidize the entire thickness of the resist layer in a relatively short time. As the depth of penetration of the implanted oxygen ions increases, a problem similar to the foregoing diffraction problem is encountered. Specifically, as the ion penetration depth increases, the probability of undesired lateral reactions between the ions and the a-Si layer increases whereby to distort the intended pattern. In contrast, because the Si—O2 pattern developed by the present invention is formed exclusively at or very near the surface of the a-Si:H layer due to the limited availability of dangling bonds provided by UV induced hydrogen removal, the aforementioned diffraction and distortion problems are eliminated.

Figure 5:
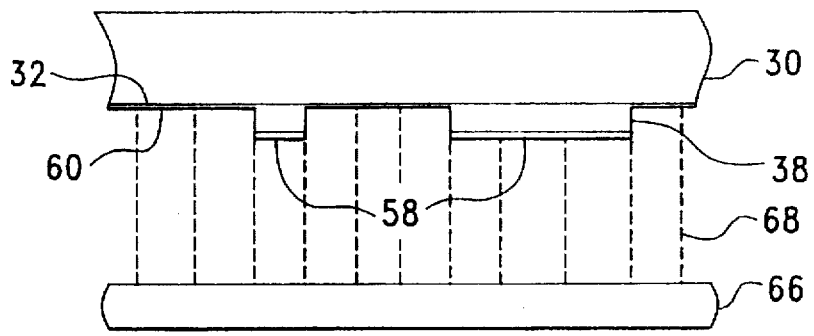
FIG. 5 is a diagrammatic cross-sectional view, in elevation, of a substrate in a confronting relationship with a hydrogen ion emission source illustrating a step for etching the amorphous silicon layer.

Turning now to FIGS. 1 and 5, etching step 20 is performed on a-Si:H layer 38 with its previously formed Si—O2 layer 58. FIG. 5 illustrates the appearance of substrate 30 at an intermediate point in removing unexposed areas 60 of a-Si layer 38. Layer 38 of substrate 30 is positioned in a confronting relationship with a collimated hydrogen plasma source 66 which emits hydrogen ions 68. Ions 68 efficiently etch away unexposed areas 60 of the a-Si layer while Si—O2 patterned areas 52 resist etching by the hydrogen ions. Even though the Si—O2 layer is very thin, it is extremely resistant to etchants such as hydrogen ions 58. It should be noted that source 66 is not limited to the emission of hydrogen ions. Alternatively, hydrogen atoms may be emitted or a combination of ions and atoms may be emitted for use as an etchant. Furthermore, source 66 may comprise various types of sources which are known in the art such as, for example, an RF plasma source or an ECR plasma source. Because the areas which are exposed to the UV light source are not removed in the etching step, the resist provided by the present invention is known as a negative resist.

Continuing to refer to FIGS. 1 and 5, the directionality or, stated in another way, required degree of collimation of ions 68 emitted by hydrogen ion source 66 is determined based upon the feature sizes of the discrete elements which are to be formed in or on substrate 30. In other words, the degree of collimation of the ions directly determines the accuracy with which the Si—O2 surface pattern is carried through the underlying deposited material. For example, insufficiently collimated ions can produce undesirable undercutting of Si—O2 layer 38 (not shown). In cases where high resolution is required, the a-Si layer should be deposited as thin as possible, for example 1000 Å. Additionally, the directionality of the emitted atoms or ions can be controlled by using more directional sources such as, for instance, the previously mentioned ECR plasma source or by other collimation methods in order to achieve the desired resolution.

Figure 6:
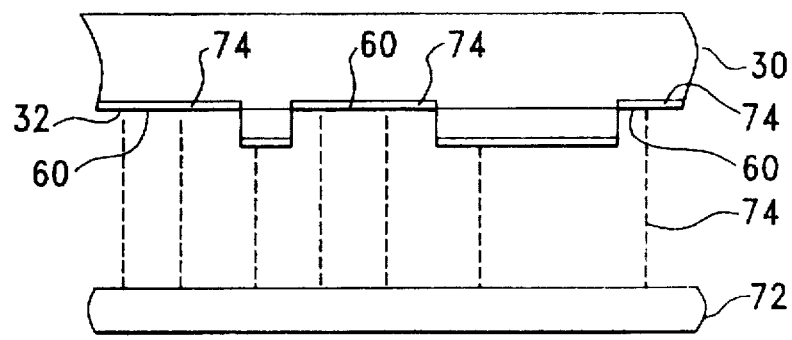
FIG. 6 is a diagrammatic cross-sectional view, in elevation, of the substrate in a confronting relationship with a dopant emission source illustrating formation of portions of discrete elements in the substrate.

Attention is now directed to FIGS. 1 and 6 wherein an implantation source 72 is shown emitting an appropriate dopant material, such as, for example, boron 74. In a manner which is well known, the boron is incident upon revealed portions 60 of substrate surface 32 whereby to form respective P-type regions 74 within substrate 30.

Following treatment of the revealed portions of the substrate, step 24 may be performed in which the developed a-Si photoresist pattern is removed (not shown) using techniques that are well known in the art. However, in some cases, the developed layer may be allowed to remain in place if its presence does not influence the particular device being produced or if subsequent device structures are to be formed on top of silicon dioxide layer 52, since the Si—O2 is an effective electrical insulator.

It should be apparent to those skilled in the semiconductor and related arts, in view of the preceding discussion, that the present invention provides significant long term solutions to problems which face the semiconductor manufacturing community. One advantage, not previously mentioned, resides in the fact that the method described herein is a dry process, as contrasted with the typical wet etching processes presently being used. In recent years, EPA regulations which cover wet chemical processes have become stringent. Since these guidelines will most likely become even more restrictive, manufacturing costs associated with wet chemical processes will become overly prohibitive.

It should also be mentioned that the dry process of the present invention is extremely well adapted to being practiced in an in-line treatment system wherein the substrate or other such article being treated remains in an evacuated environment throughout the entire procedure. In such an in-line system, the possibility of introducing contaminants is greatly reduced because the articles being treated remain in a vacuum sealed, isolated environment throughout the process. In-line systems may also be automated, still further reducing the need to expose treated articles to the ambient surroundings and reducing production costs. All of these factors couple with the direct advantages of the present invention to improve through-put and yield in future in-line systems.

Several other advantages result directly from the relatively low temperature at which the invention is practiced. First, substrates which are sensitive to higher temperatures are not harmed. Second, production costs are reduced because the need for generating high process temperatures is eliminated. And third, the present invention utilizes steps which are highly efficient, utilizing brief exposure times useful in high through-put, high yield systems.

While the foregoing advantages are aspects of the present invention which resolve important concerns of the semiconductor industry, one ongoing concern is focused on the ability to produce ever smaller discrete element features. The present invention introduces a viable method for performing high resolution lithography using amorphous silicon as a photoresist. In using this method, feature sizes defined by the amorphous silicon can approach the sub-atomic structure size of amorphous silicon itself The current resolution restriction imposed by the relatively large molecule size of organic photoresists is removed. Furthermore, this viable method eliminates the use of organic photoresists which are known to introduce organic contamination onto a substrate surface. a-Si, in contrast, is not only inorganic, but is fundamentally similar to most substrate materials, especially crystalline silicon. Thus, the organic contamination problem is eliminated.

Therefore, it should be understood that the present invention may be embodied in many other specific forms without departing from the spirit or scope of the invention. The present examples and methods are considered as illustrative and not restrictive, and the invention is not to be limited to the details given herein, but may be modified within the scope of the appended claims.

What is claimed is:

1. A method of forming a resist on a surface, said method comprising, the steps of:
  a) forming a thin film on said surface including at least an outermost layer which includes hydrogenated amorphous silicon;

b) exposing predetermined areas of said outermost layer to ultraviolet light such that the ultraviolet light reacts with the hydrogenated amorphous silicon in a way which accelerates the formation of a thin layer consisting essentially of silicon dioxide in said predetermined areas of said outermost layer so as to cause said exposed areas of the outermost layer to be resistant to a specific etchant; and c) removing unexposed areas of said outermost layer and any underlying associated portions of said film by using said etchant so as to reveal said surface in areas which underlie the unexposed outermost layer portions.

2. A method according to claim 1 wherein all of said thin film is formed from a material consisting essentially of hydrogenated amorphous silicon.

3. A method according to claim 2 wherein said step of forming said thin film on said surface is performed at a temperature no greater than about 100° C.

4. A method according to claim 2 wherein said hydrogenated amorphous silicon layer includes a predetermined thickness and wherein said step of exposing the hydrogenated amorphous silicon to ultraviolet light is performed so as to form said layer of silicon dioxide having a thickness which is less than the predetermined thickness of the hydrogenated amorphous silicon layer.

5. A method according to claim 1 wherein said step of exposing said predetermined areas of said outermost layer to ultraviolet light is performed at a temperature no greater than about 100° C.

6. A method according to claim 1 wherein said step for exposing said outermost layer to ultraviolet light includes the step of passing said light through a patterned film having light transmissive regions and opaque regions wherein said light transmissive regions correspond to said predetermined areas.

7. A method according to claim 1 wherein said unexposed areas of said outermost layer along with any associated underlying portions of said thin film are removed by a dry etching process.

8. A method according to claim 7 wherein the unexposed areas of said outermost layer and associated portions of said thin film are removed using a hydrogen plasma source.

9. A method according to claim 1 wherein said surface is defined by a crystalline silicon substrate.

10. A method according to claim 1 wherein said surface remains in an evacuated environment during formation of said resist.

11. A method according to claim 1 wherein said step for forming said film includes the steps of first depositing a layer of amorphous silicon onto said surface and, thereafter, hydrogenating said amorphous silicon layer whereby to form said outermost layer.

12. A method according to claim 11 wherein said outermost hydrogenated amorphous silicon layer includes a predetermined thickness and wherein said step of exposing the outerinost layer to ultraviolet light is performed so as to form said layer of silicon dioxide having a thickness which is less than the predetermined thickness of the outermost layer.

13. A method according to claim 12 wherein the thickness of the silicon dioxide layer is at least 5 Å.

14. A method according to claim 11 wherein said step of hydrogenating said amorphous silicon layer is performed at a temperature no greater than about 100° C.

15. A method according to claim 14 wherein said amorphous silicon layer is hydrogenated using a low energy hydrogen plasma source.

16. A method according to claim 14 wherein said amorphous silicon layer is hydrogenated using a solution of hydrofluoric acid.

17. A method of forming a resist on a surface, said method comprising the steps of:

a) applying a film including hydrogenated amorphous silicon on said surface;

b) exposing predetermined areas of said film to ultraviolet light such that the ultraviolet light reacts with the hydrogenated amorphous silicon in a way which accelerates the formation of a thin layer consisting essentially of silicon dioxide in said predetermined areas of said outermost layer so as to cause said exposed areas of the film to be resistant to a specific etchant; and c) removing the unexposed areas of hydrogenated amorphous silicon from said surface by using said etchant such that said exposed areas of said film remain on said surface so as to define said resist.

18. A method according to claim 17 wherein said hydrogenated amorphous silicon is applied at a temperature no greater than about 100° C.

19. A method according to claim 18 wherein said step of exposing said hydrogenated amorphous silicon to ultraviolet light is performed at a temperature no greater than about 100° C.

20. A method of forming a resist on a surface, said method comprising the steps of:

a) applying a thin film of hydrogenated amorphous silicon based alloy on said surface;

b) exposing predetermined areas of said thin film to ultraviolet light such that the ultraviolet light reacts with the hydrogenated amorphous silicon in a way which accelerates the formation of a thin layer consisting essentially of silicon dioxide in said predetermined areas of said outermost layer so as to cause said exposed areas to be resistant to a specific etchant; and c) removing the unexposed areas of said thin film from said surface using said etchant so as to reveal immediately underlying regions of said surface such that said exposed areas remain on said surface defining said resist.

21. A method according to claim 20 wherein said thin film is applied at a temperature no greater than about 100° C.

22. A method according to claim 21 wherein said step of exposing said thin film to ultraviolet light is performed at a temperature no greater than about 100° C.

23. A method of forming a resist on a surface, said method comprising the steps of:

a) forming a thin film on said surface including amorphous silicon;

b) hydrogenating said thin film;

c) exposing predetermined areas of the hydrogenated thin film to ultraviolet light such that the ultraviolet light reacts with the hydrogenated amorphous silicon in a way which accelarates the formation of a thin layer consisting essentially silicon dioxide in said predetermined areas of said outermost layer so as to cause said exposed areas to be resistant to a specific etchant; and d) thereafter, removing unexposed areas of said hydrogenated thin film using said etchant, so as to reveal said surface in areas which underlie the unexposed areas.

24. A method according to claim 23 wherein said thin film is hydrogenated at a temperature no greater than about 100° C.

25. A method according to claim 24 wherein said step of exposing said thin film to ultraviolet light is performed at a temperature no greater than about 100° C.

* * * * *